(12) United States Patent
Chipalkatti et al.

(10) Patent No.: US 11,495,568 B2
(45) Date of Patent: Nov. 8, 2022

(54) IC PACKAGE DESIGN AND METHODOLOGY TO COMPENSATE FOR DIE-SUBSTRATE CTE MISMATCH AT REFLOW TEMPERATURES

(71) Applicant: Nvidia Corporation, Santa Clara, CA (US)

(72) Inventors: Jayprakash Chipalkatti, Santa Clara, CA (US); Zuhair Bokharey, Santa Clara, CA (US); Don Templeton, Santa Clara, CA (US); Brian Schieck, Santa Clara, CA (US); Julie Lam, Santa Clara, CA (US); Prashant Pathak, Santa Clara, CA (US)

(73) Assignee: NVIDIA Corporation, Santa Clara, CA (US)

( * ) Notice: Subject to any disclaimer, the term of this patent is extended or adjusted under 35 U.S.C. 154(b) by 101 days.

(21) Appl. No.: 17/155,874

(22) Filed: Jan. 22, 2021

(65) Prior Publication Data

US 2021/0151403 A1 May 20, 2021

Related U.S. Application Data

(62) Division of application No. 16/553,962, filed on Aug. 28, 2019, now Pat. No. 10,943,882.

(51) Int. Cl.
*H01L 23/00* (2006.01)
*H01L 21/66* (2006.01)

(52) U.S. Cl.
CPC .............. *H01L 24/14* (2013.01); *H01L 22/14* (2013.01); *H01L 24/06* (2013.01); *H01L 24/11* (2013.01); *H01L 24/13* (2013.01); *H01L 2224/02381* (2013.01); *H01L 2224/0401* (2013.01); *H01L 2224/13027* (2013.01); *H01L 2224/13147* (2013.01); *H01L 2224/13582* (2013.01); *H01L 2224/13655* (2013.01); *H01L 2224/14179* (2013.01); *H01L 2224/8121* (2013.01); *H01L 2224/81143* (2013.01); *H01L 2924/014* (2013.01)

(58) Field of Classification Search
CPC .......... H01L 24/14; H01L 22/14; H01L 24/06
See application file for complete search history.

(56) References Cited

PUBLICATIONS

Yu, et al.; "Study of 15μm Pitch Solder Microbumps for 3D IC Integration"; Electronic Components and Technology Conference; 2009; 6 pages.

*Primary Examiner* — Anthony Ho

(57) ABSTRACT

An IC package including an integrated circuit die having a major surface and one or more solder bumps located on the major surface in at least one corner region of the major surface and a substrate having a surface, the surface including bump pads thereon. The major surface of the integrated circuit die faces the substrate surface, the one or more solder bumps are bonded to individual ones of the bump pads to thereby form a bond joint, the major surface of the integrated circuit die has a footprint area of at least about 400 mm². A ratio of a coefficient of thermal expansion of the substrate ($CTE_{sub}$) to a coefficient of thermal expansion of the integrated circuit die ($CTE_{die}$) is at least about 3:1. A method of manufacturing an IC package is also disclosed.

14 Claims, 5 Drawing Sheets

Figure 1:
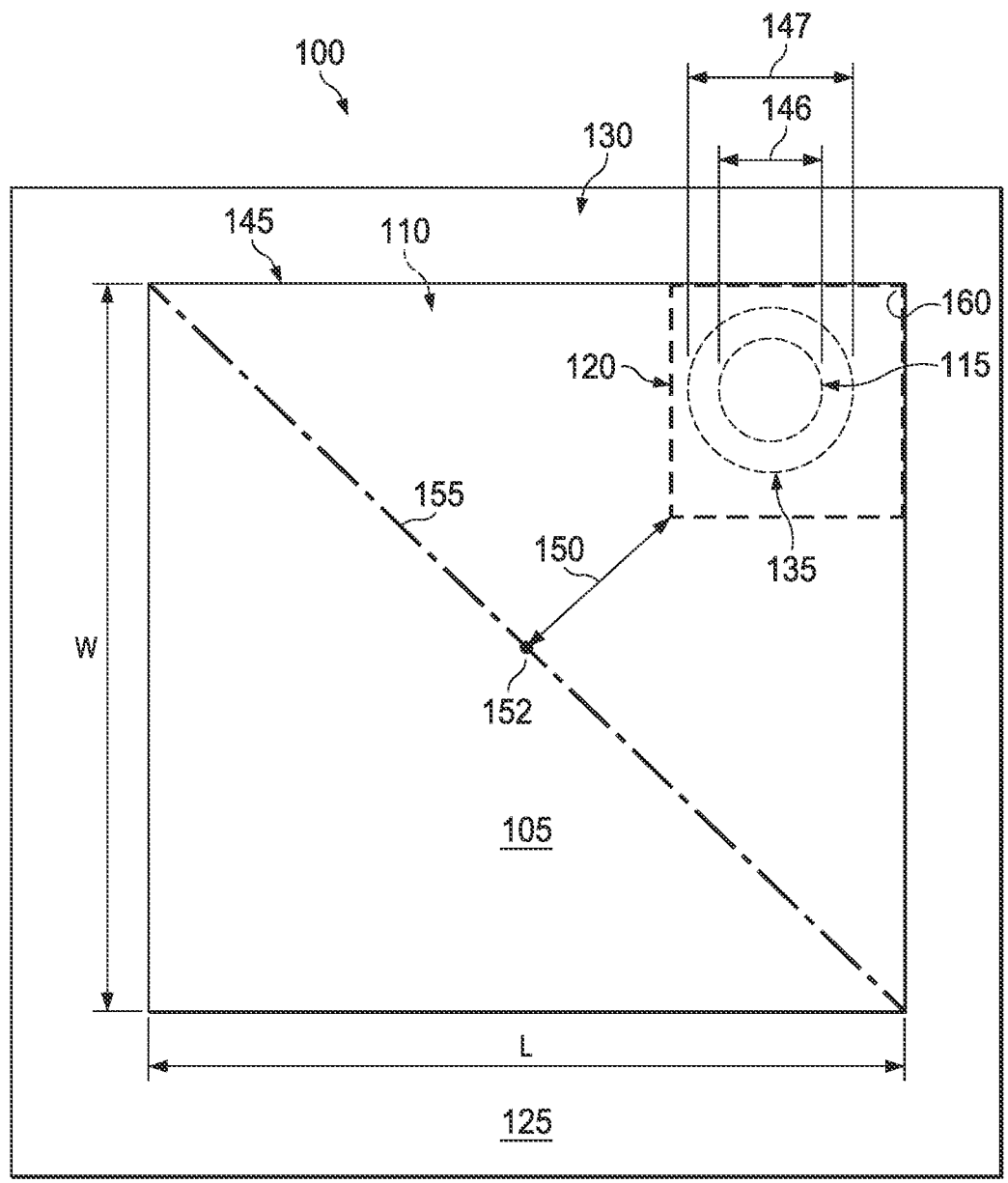

IC PACKAGE DESIGN AND METHODOLOGY TO COMPENSATE FOR DIE-SUBSTRATE CTE MISMATCH AT REFLOW TEMPERATURES

CROSS-REFERENCE TO RELATED APPLICATION

This application is a divisional of U.S. patent application Ser. No. 16/553,962, entitled "IC PACKAGE DESIGN AND METHODOLOGY TO COMPENSATE FOR DIE-SUBSTRATE CTE MISMATCH AT REFLOW TEMPERATURES", filed Aug. 28, 2019. The above-listed application is commonly assigned with the present application is incorporated herein by reference as if reproduced herein in its entirety.

TECHNICAL FIELD

This application is directed, in general, to integrated circuit packages and methods of manufacturing thereof.

BACKGROUND

Improvements in integrated circuit (IC) fabrication techniques allow the production of larger area dies (IC dies) to accommodate higher densities of transistor devices therein. This, in turn, places an increasing demand on packaging techniques to provide an increased number of aligned electrical connections between the die and the substrate (IC package substrate). As the density of connections between the die and the substrate increase, differences in the thermal properties of the die and IC package take on added importance.

SUMMARY

One aspect of the present disclosure provides an integrated circuit package including an integrated circuit die having a major surface and one or more solder bumps located on the major surface in at least one corner region of the major surface and a substrate having a surface, the surface including bump pads thereon. The major surface of the integrated circuit die faces the substrate surface, the one or more solder bumps are bonded to individual ones of the bump pads to thereby form a bond joint, the major surface of the integrated circuit die has a footprint area of at least about 400 mm². A ratio of a coefficient of thermal expansion of the substrate ($CTE_{sub}$) to a coefficient of thermal expansion of the integrated circuit die ($CTE_{die}$) is at least about 3:1

In another aspect, a method of manufacturing an IC package is disclosed. The method includes providing a test one of an integrated circuit die having a major surface and a solder bump located on the major surface and providing a test one of a substrate having a surface, the surface including a bump pad located thereon. The bump pad is at a location on the surface for alignment and bonding to the solder bump when the die is positioned at a target mounting location relative to the substrate with the die and the substrate at room temperature. The method also includes determining a shrinkage factor (SF) for the bump pad according to the formula: $SF = 1 - (\Delta D_{offset}/D_{rt})$. $D_{rt}$ is a distance between a center of the die and a center of the solder bump with the solder bump and the bump pad aligned with each other and the die at the target mounting location at room temperature. $\Delta D_{offset} = |D_{substrate\ reflow} - D_{pad\ reflow}|$. $D_{substrate\ reflow}$ is a lateral offset distance between the center of die. $D_{pad\ reflow}$ is an offset distance between the center of the die and the solder bump, with the die positioned at the target mounting location and with the test die and the test substrate at an alignment reflow temperature for bonding the solder bump to the bump pad. The method further includes forming another of the bump pad on the surface of a production one of the substrate, wherein the location of the bump pad on the production substrate is offset by the shrinkage factor multiplied by the bump pad location on the test substrate such that a lateral distance between a center of the die and the bump pad on the production substrate at room temperature equals $SF \times D_{rt}$. The method also includes positioning a production one of the integrated circuit die and the production substrate such that a production one of the solder bump on the major surface of the production integrated circuit die faces the production substrate surface at the target mounting location. The method further includes forming a bond joint between the production solder bump and the production bump pad, the forming including applying a heat reflow cycle to the production die and the production substrate.

BRIEF DESCRIPTION

Figure 2:
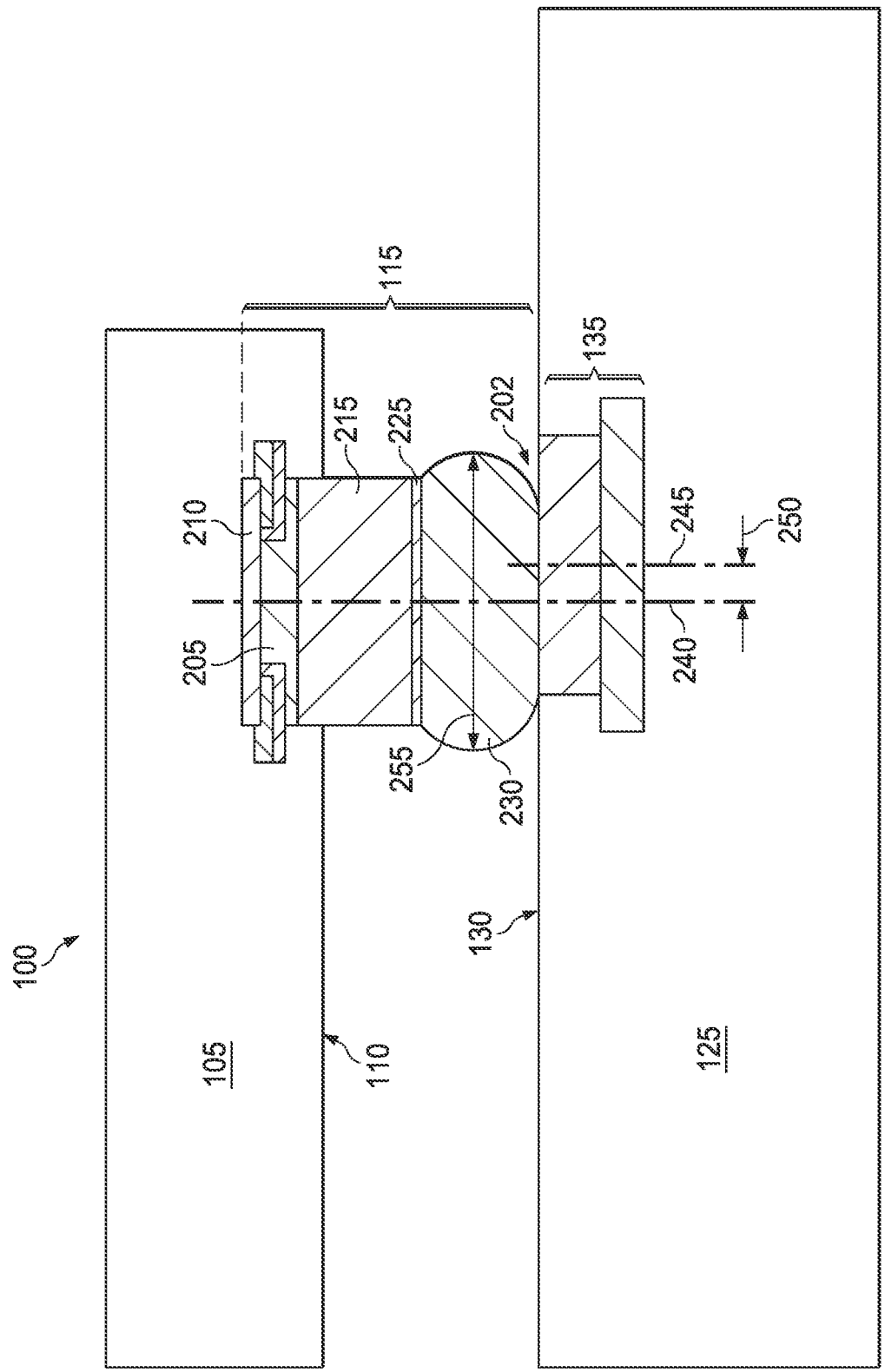
Figure 3:
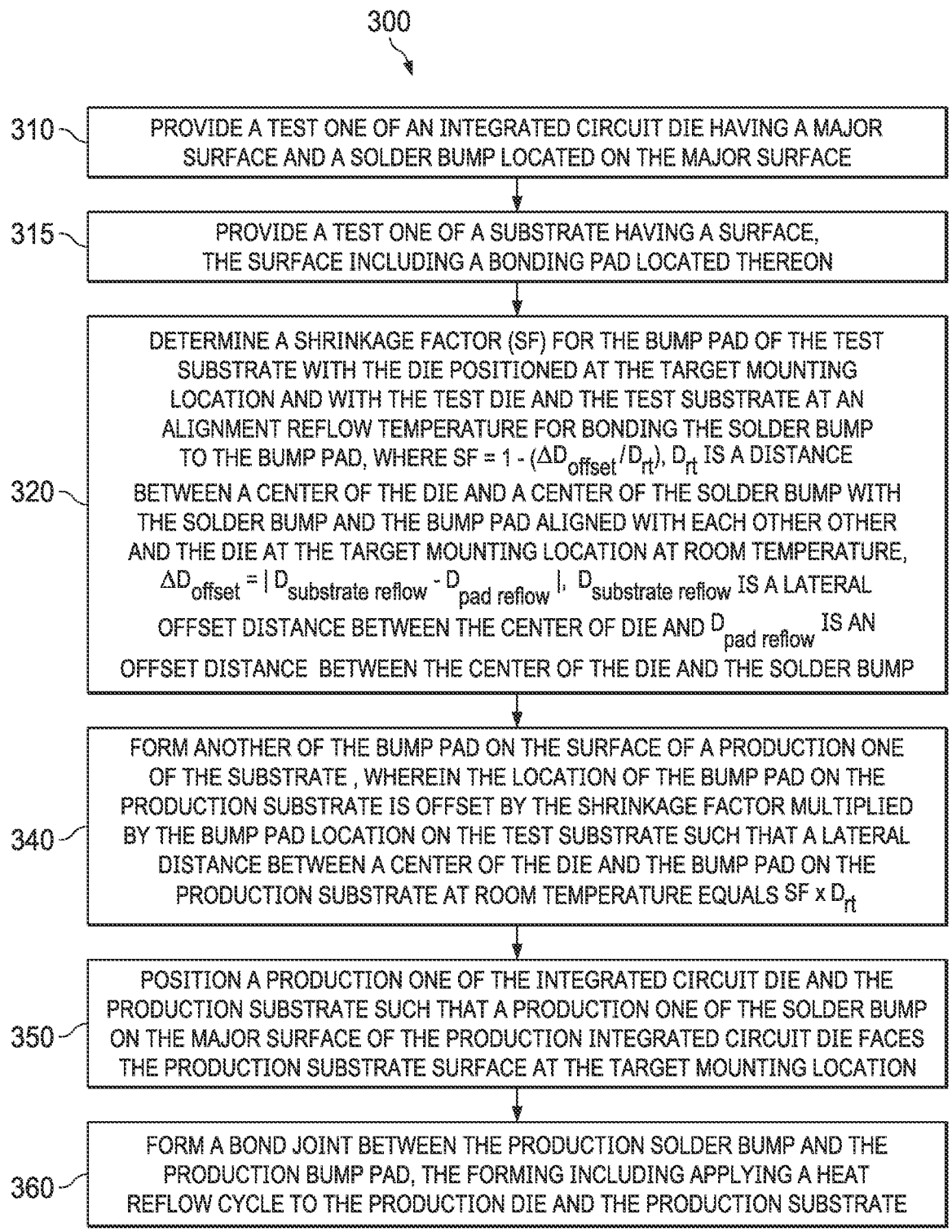

Reference is now made to the following descriptions taken in conjunction with the accompanying drawings, in which:

FIG. 1 presents a plan view of an example embodiment of an IC package manufactured according to the principles of the disclosure;

FIG. 2 present a cross-sectional detail view of a solder bump and bump pad of an example embodiment of an IC package, similar to the IC package discussed in the context of FIG. 1;

FIG. 3 presents a flow diagram of example embodiments of a method of manufacturing an IC package according to the principles of the disclosure, including any of the package embodiments, such as disclosed in the context of FIGS. 1 and 2; and FIGS. 4A-4D show cross-sectional views analogous to that shown in FIG. 2 for example embodiments of test and production dies and substrates at selected stages of the method, such as disclosed in the context of FIG. 3.

DETAILED DESCRIPTION

We present a solution to new challenges of achieving improved solder bump-bump pad alignment in IC packages, including packages using larger area dies (e.g., die areas equal to greater than about 400 mm²) to accommodate more complex circuitry, including an increasing pitch density of solder bumps and/or decreasing diameters of solder bumps and corresponding bump pads. For such dies, when there is a large difference in the coefficient of thermal expansion of the die ($CTE_{die}$) and substrate ($CTE_{sub}$), the precise alignment and thermal bonding between the solder bumps of the die and the bump pads of the substrate can become difficult to achieve, due to large differences in the relative expansion of the die and the substrate during thermal heat cycling.

Consider, for example, a die and substrate having a $CTE_{die}$ and $CTE_{sub}$ equal to about 3 and 12 ppm/° C. respectively, and the die positioned at a mounting position relative to the substrate such that, at room temperature (25° C.), a solder bump on the die is aligned with a bump pad on the substrate. During a heating reflow cycle to create a solder bond joint, the substrate, due to its higher CTE, will expand more than the die thereby causing misalignment between the solder bump and the bump pad. If the misalignment is great enough, the solder bond joint may not form, or, if the misalignment is partial, the solder bond joint forms but the misalignment is sufficient that the canted or tilted bond joint may be prone to cracking, during use or during a thermal cycling test to evaluate bond joint integrity, due to internal stresses.

As further disclosed herein, we have developed a shrinkage factor, that when applied, adjusts the planned location of the bump pad on the substrate such that, at room temperature, the bump pad is offset relative to its corresponding solder bump on the die. The shrinkage factor accounts for the differences in $CTE_{die}$ and $CTE_{sub}$ such that the bump pads and solder bumps will become aligned during a thermal heat cycle such that solder bump and bump pad are substantially aligned and thereby form a solder bond joint that can maintain integrity during a thermal cycling test.

This is in contrast to some previous flip chip bonding processes where the bump pads are positioned on the substrate such that there is a zero offset relative to their corresponding solder bumps at room temperature. Consequently, during heating reflow cycle the locations of the solder bumps and bump pads become misaligned due to the differences in $CTE_{die}$ and $CTE_{sub}$. We believe that, while for smaller area dies (e.g., die areas of less than 400 mm$^2$) and larger solder bump and bump pad diameters (e.g., greater than 200 μm), a degree of misalignment during the thermal heat cycle can be tolerated with the solder bond joint still being formed, larger area dies are surprisingly intolerant to misalignment, especially in perimeter regions of the die such as corner regions of the die.

One aspect of the disclosure is an integrated circuit package. FIG. 1 illustrates a plan view of an embodiment of an example IC package 100 constructed according to the principles of the disclosure. FIG. 2 illustrates a cross-sectional detailed view a solder bump and bump pad pair for an embodiment of an example IC package 100, similar to the IC package illustrated in FIG. 1.

With continuing reference to FIGS. 1-2 throughout, embodiments of the integrated circuit package 100 can include an integrated circuit die 105 having a major surface 110 and one or more solder bumps 115 located on the major surface 110 in at least one corner region 120 of the major surface 110. The package 100 can also include a substrate 125 having a surface 130, the surface 130 including bump pads 135 thereon. The major surface 110 of the integrated circuit die 105 faces the substrate surface 130. The one or more solder bumps 115 are bonded to individual ones of the bump pads 135 to thereby form a bond joint 202. The major surface of the integrated circuit die has a footprint area (e.g., defined by perimeter 145) of at least about 400 mm$^2$. A ratio of a coefficient of thermal expansion of the substrate (e.g., $CTE_{sub}$) to a coefficient of thermal expansion of the integrated circuit die (e.g., $CTE_{die}$) is at least about 3:1.

Non-limiting example embodiments of the die 105 can include square or rectangular shaped dies, e.g., having areas of 400 mm$^2$ or greater. As non-limiting examples, the length and width (e.g., FIG. 1, L and W) of the die can about 26 mm and 16 mm, 24 mm and 19 mm, 20 mm and 20 mm, 25 mm and 25 mm or 30 mm and 30 mm, respectively.

In some embodiments, to facilitate providing a high density of the solder bumps per unit area of the die, an average diameter (e.g., FIG. 1, diameter 146) of the one or more solder bumps 115 can be a value in a range from about 10 to 200 microns, and in various embodiments, have an average diameter value in a range from about 10 to 20, 20 to 40, 40 to 60 or 60 to 80, 80 to 100, or 100 to 150 microns. In some such embodiments, the bump pad diameter (e.g., FIG. 1, diameter 147) can range from 1 to 1.5 times the diameter of the solder bump (e.g., 10 to 300 microns).

In some embodiments, the corner region 120 has a separation distance 150 from a center 152 of the integrated circuit die major surface 110 that is equal to or greater than about 40 percent of a diagonal distance 115 of the major surface 110. In various embodiments, the separation distance 150 can be a distance value in a range of about 40 to 50, 50 to 60, 60 to 70, 70 to 80 or 80 to 90 percent of the diagonal distance 115.

In some embodiments, the one or more solder bumps 115 are part of an array (e.g., a ball grid array) on the major surface 110, the solder bumps of the array individually bonded to a corresponding array of the bump pads 115 on the substrate surface 130, e.g., to form an array of the bond joints 202, as part of flip chip bonding processes familiar to those skilled in the pertinent arts.

In some embodiments, the one or more solder bumps 115 can include an under bump metallization (UBM) region 205, the UBM region 205 located between a redistribution metal layer 210 and a pillar layer 215 including copper, the pillar layer 215 located over a layer 220 including nickel and a solder layer 230 (e.g., lead free solder). One skilled in the pertinent art would be familiar with various types of thin film UBM stacks to provide an electrical and mechanical connection between the solder bump 105 and bump pad 115 and a barrier to limit the undesired diffusion of copper atoms to the die 105.

As further explained in the context of FIG. 3, the IC packages 100 is manufactured such that the solder bump 105 and bump pad 115 are substantially aligned with each other through the bond joint 202 at an alignment reflow temperature. For instance, in some embodiments, each of the bond joints 202 has an alignment such that a center line 240 of the solder bump 115 and a center line 245 of the bump pad 135 are laterally displaced by a separation distance 250 that is less than about one-half a diameter 255 of the solder bump 115, and in some embodiments, less than one-third or less than one-quarter or less than one-tenth the diameter 255 of the solder bump 115.

The bond joints 202 formed between substantially aligned solder bumps and bump pads facilitates the bond joint 202 maintaining its integrity following a thermal cycling test. The term integrity, as used herein, means that visual examination of the bond joint reveals no signs of physical cracks, and, that electrical measurements of functionality reveals no loss in electrical continuity through the bond joint. One skilled in the pertinent art would be familiar with standardize test conditions to assess the integrity of the bond joint, e.g., using test conditions such as specified using spec JESD22-A104D (Joint Electron Tube Engineering Council, JEDEC, Arlington, Va.). As a non-limiting example, some embodiments follow a thermal cycling test that include temperature cycling from −40° C. to 125° C. for 1000 cycles with a rate of about 2.5 to 3 cycles per hour. For example, in some embodiments after such a thermal cycling test, the bond joints 202 show no physical signs of cracks and an electrical conductivity through the bond joints is substantially the same (e.g., within ±10 or ±1 percent, in some embodiments) as the electrical conductivity prior to the thermal cycling test.

As noted above, the coefficient of thermal expansion of the substrate ($CTE_{sub}$) and the coefficient of thermal expansion of the die ($CTE_{die}$) are substantially different from each other, e.g., having a $CTE_{sub}$:$CTE_{die}$ ratio of about 3:1 or greater in some embodiments. For instance, in some embodiments the die can be composed of an inorganic semiconductor material (e.g., silicon) having a $CTE_{die}$ value in a range from about 2.5 to 3.5 ppm/° C. For instance, in some embodiments, the substrate can be composed of a composed of an organic material (e.g., glass fiber reinforced epoxy or phenolic resins) having a $CTE_{sub}$ value in a range from about 10 to 16 ppm/° C.

In some embodiments, the substrate 125 is a printed circuit board, and includes multiple metal vias connected to the bump pads, the metal vias located in interconnection layers of the substrate 125.

In some embodiments, the bump pads of the substrate are C4 pads (controlled collapse chip connection pads) as familiar to those skilled in the pertinent art.

In various embodiments, the package 100 can be configured as a data center/server device package, a system-on-a-chip (SoC) package, a graphical processing unit device package, central processing unit package, an AI machine learning device package, or combinations thereof.

Embodiments of the package can be used in high temperature (e.g., up to about 125° C. in some embodiments) and/or vibrating environments, where having bond joints with high integrity would be advantageous. Non-limiting examples include IC packages adapted for use in a motorized vehicle, including an autonomous vehicle, e.g., a SoC package to control a vehicle's operation, such as an automobile including an autonomously driven automobile.

Another aspect of the disclosure is a method of manufacturing an integrated circuit package. FIG. 3 presents a flow diagram of example embodiments of a method 300 of manufacturing an IC package according to the principles of the disclosure such as any embodiments of the IC package 100 disclosed in the context of FIGS. 1 and 2.

FIGS. 4A-4D show cross-sectional views, analogous to that show in FIG. 2, of example embodiments of test and production dies and substrates at selected stages of the method embodiments as discussed in the context of FIG. 3.

With continuing reference to FIGS. 1-4D throughout, embodiments of the method 300 includes providing a test one of an integrated circuit die having a major surface and a solder bump located on the major surface (step 310, e.g., a test one of die 105*a* with a test solder bump 115 on surface 110), and, providing a test one of a substrate having a surface, the surface including a bump pad located thereon (step 315, e.g., a test bump pad 135 on surface 130 of a test one of substrate 125*a*). The bump pad is at a location on the surface 130 for alignment and bonding to the solder bump when the die is positioned at a target mounting location (e.g., a flip-chip mounting location) relative to the substrate with the die and the substrate at room temperature.

The method 300 further includes determining a shrinkage factor (SF) (FIG. 3, step 320) for the bump pad according to the formula: $SF=1-(\Delta D_{offset}/D_{rt})$. $D_{rt}$ is a distance between a center of the die (e.g., die center 152, FIG. 4A) and the center of the solder bump (e.g., solder bump center 240, FIG. 4A) with the die and the substrate aligned with each other at room temperature (e.g., about 25° C.). $\Delta D_{offset}$ is the absolute value of $D_{substrate\ reflow}$ minus $D_{pad\ reflow}$ (e.g., $|D_{substrate\ reflow}-D_{pad\ reflow}|$), where $D_{substrate\ reflow}$ is a lateral offset distance between the center of die and $D_{pad\ reflow}$ is an offset distance between the center of the die and the solder bump, with the die positioned at the target mounting location relative to the substrate, and with the test die and the test substrate at an alignment reflow temperature for bonding the solder bump to the bump pad.

Figure 4A:
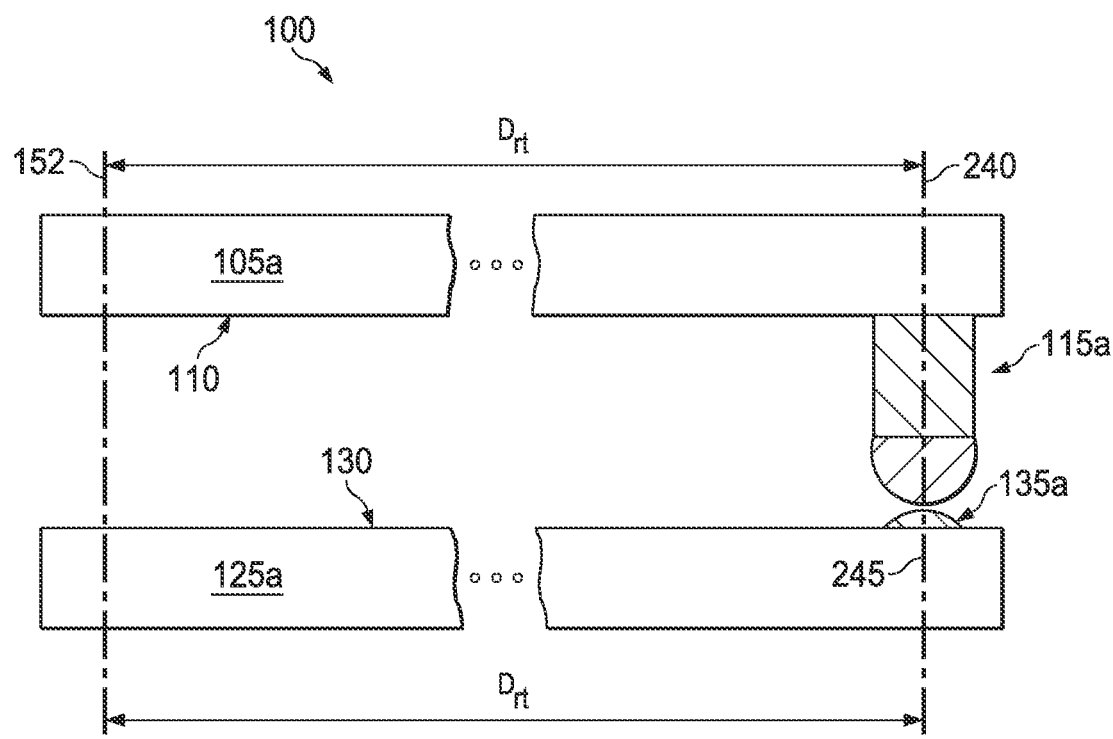
Figure 4B:
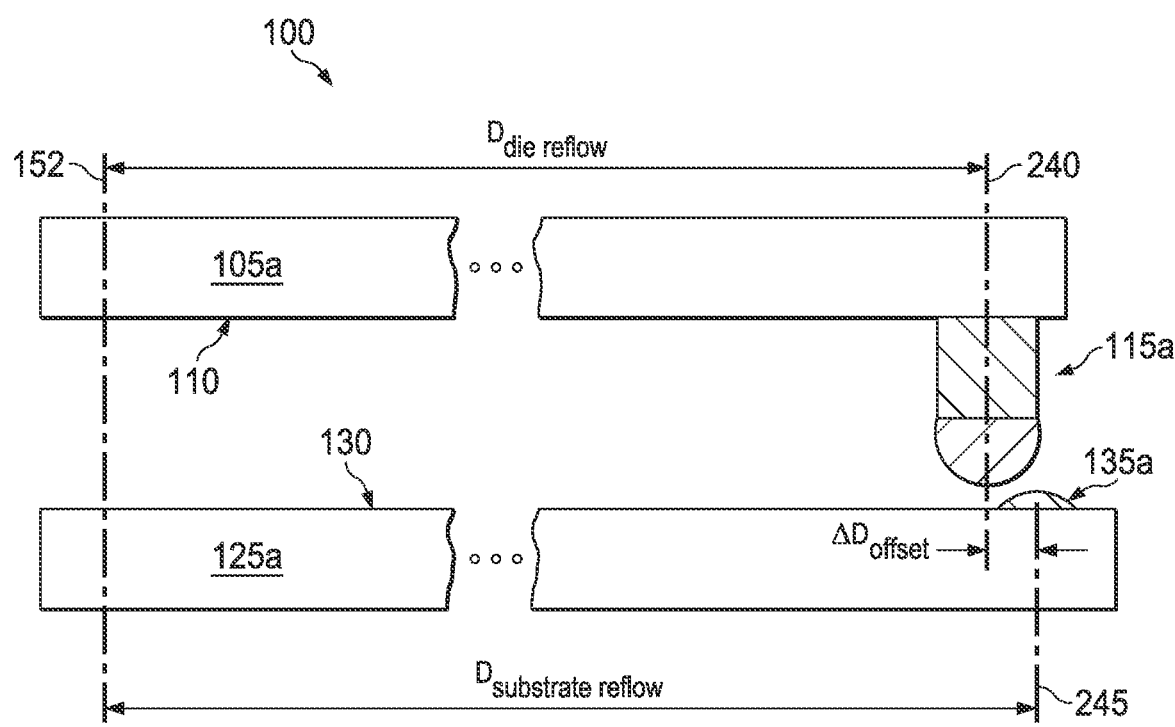

For instance, as shown in FIG. 4B, at elevated temperatures, such as during a heat reflow cycle applied to the test die 105*a* and test substrate 125*a*, both the die and substrate expand, but, the substrate expands to a greater extent than the die because $CTE_{substrate}$ is greater than $CTE_{die}$. Consequently, the center 245 of the test bump pad 135*a* becomes offset from the center 240 of the test solder bump 115*a* at the elevated temperature. The extent of the offset is used as part of determining the SF using the above formula, and the SF, in turn, is applied to determine a re-location of the bump pad formed on a production substrate so that the solder bump and solder pad will be aligned at the elevated temperature.

Figure 4C:
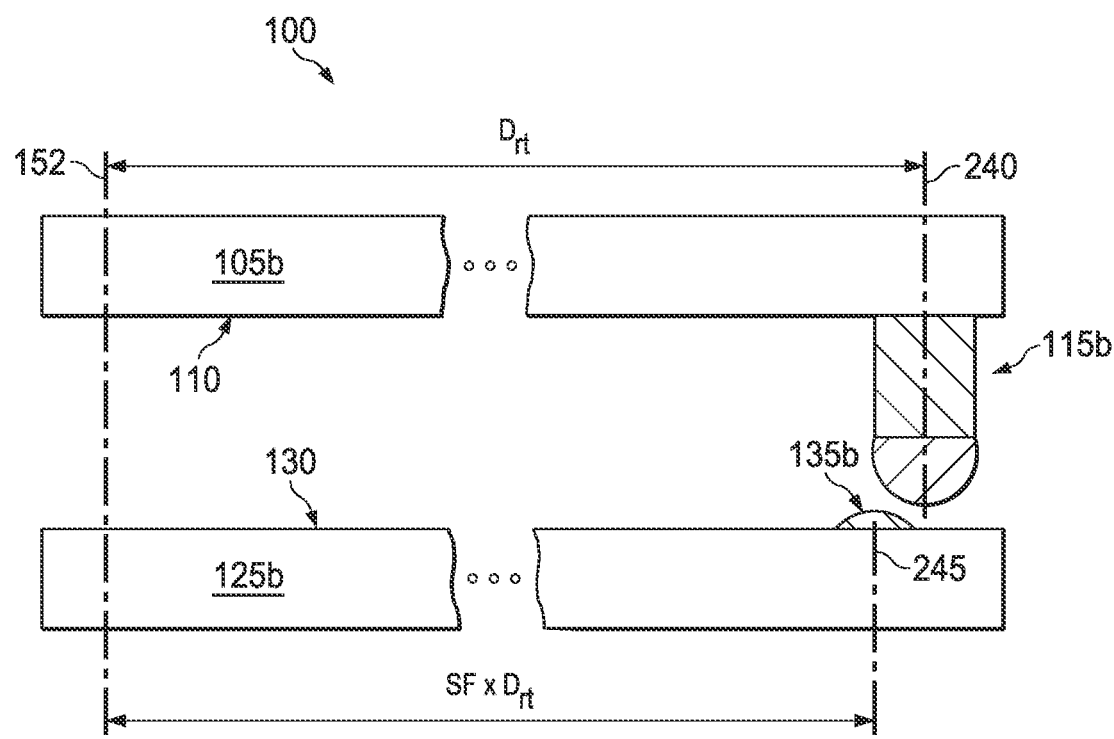

The method 300 further includes forming another of the bump pad on the surface of a production one of the substrate (FIG. 3, step 340, e.g., FIG. 4C production bump pad 135*b* on production substrate 125*b*). The location of the bump pad on the production substrate is offset by the shrinkage factor multiplied by the bump pad location on the test substrate such that a lateral distance between a center of the die and the pad bump on the production substrate at room temperature equals $SF \times D_{rt}$.

For instance, when the test die is positioned at the target mounting location relative to the test substrate, such as illustrated in FIG. 4A, the lateral distance between the center 152 of the test die 105 and the test bump pad 135*a* on the test substrate 125*a* equals $D_{rt}$ because the aligned centers 240, 245 of the test solder bump 240 and test bump pad 245 are concentric with each other.

Multiplying $D_{rt}$ by SF provides a re-positioned location of the production bump pad on the production substrate, relative to the test substrate, such that at the elevated alignment reflow temperature, the production bump pad and the production solder bump will be aligned and thereby able to form a bond joint with a desired level of integrity, such as disclosed elsewhere herein in the context of FIG. 1-2.

For instance, as illustrated in FIG. 4C, at room temperature, the lateral distance between the center 152 of the production die 105*b* and the production bump pad 135*b* on the production substrate 125*b* is $D_{rt}$ multiplied by SF. The re-location of the production bump pad 135*b* provides a compensation for the greater expansion of the substrate than the die during a heat reflow cycle. Because the re-location of the production bump pad 135*b* on the production substrate 125*b* is laterally closer to the center of the die, this relocation on the production substrate is referred to as being shrunken as compared to the position of the test bump pad 135*a* on the test substrate 125*a*. The degree of such shrinkage is defined by the value of the shrinkage factor, SF. Note that the position of the production solder bump 115*b* on the production die 105*b* is not relocated and not different from the position of the test solder bump 115*a* on the test die 105*a*.

The method 300 further includes positioning the production one of the integrated circuit die 105*b* and the production substrate 125*b* such that the production one of the solder bump 115*b* (re-positioned such as disclosed above) on the major surface 110 of the production integrated circuit die 105*b* faces the production substrate surface 130 at the target mounting location (FIG. 3, step 350).

Figure 4D:
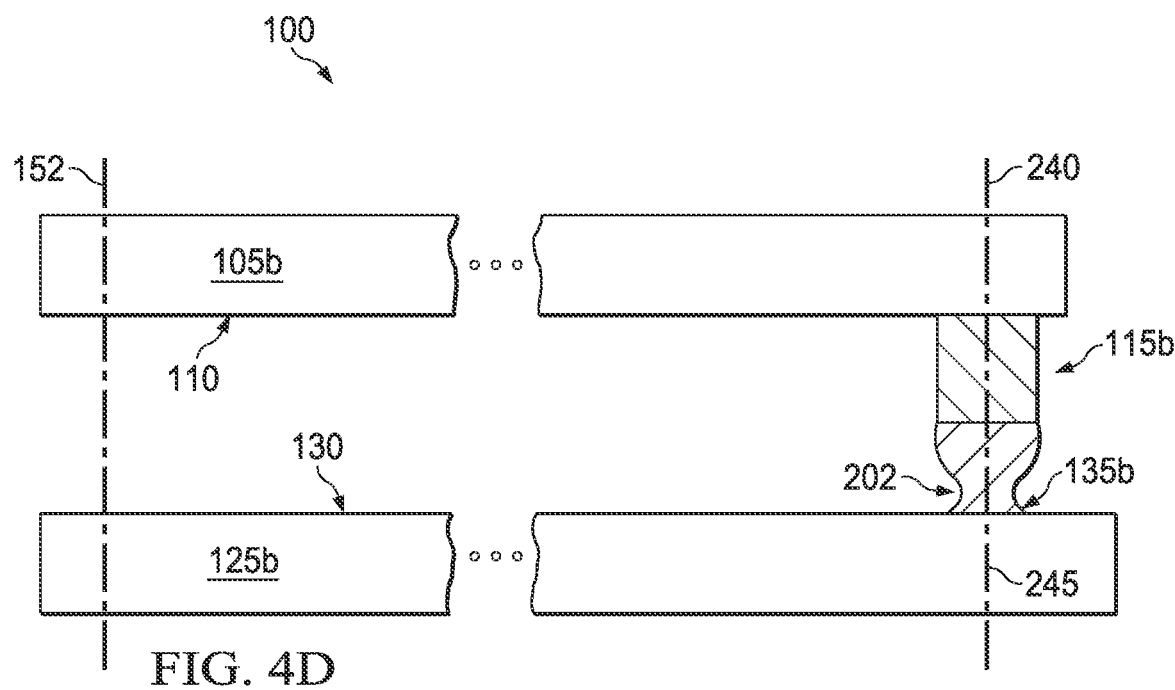

The method 300 further includes forming a bond joint between the production solder bump 115*b* and the production bump pad 135*b*, the forming including applying a heat reflow cycle to the production die 105*b* and the production substrate 125*b* (FIG. 3, step 360, e.g., FIG. 4D, bond joint 202).

To further illustrate aspects of the method 300, consider the manufacture of an example IC package including a die with a foot print area of 500 mm² (e.g., FIG. 1, L=25 mm W=20 mm) and with a solder bump center 240 located about 0.45 mm and 0.45 mm away from a corner of the die (e.g., FIG. 1, die corner 160), e.g., with L and W coordinates of 12.05 mm (12050 µm) and 9.55 mm (9550 µm), respectively, with respect to the center 152 of the die designated as having L and W coordinates of 0 mm and 0 mm. When the substrate is at its target mounting location relative to the substrate, a corresponding bump pad center 245 of the substrate is aligned with the bump pad center 240 at room temperature (25° C.). The bump pad center has the same lateral L and W coordinates of 12.05 mm and 9.55 relative to the die center and therefore the corresponding $D_{rt}$ for the solder bump and bump pad both equal 15.3755 mm (e.g., $\sqrt{(12.05^2+9.22^2)}$ or 15375.5 µm). Further assume that $CTE_{die}$ and $CTE_{substrate}$ equal 2.6 and 12.0 ppm/° C. respectively, corresponding to a CTE mismatch (ΔCTE) of 9.4 ppm° C.

For such a package, at an alignment reflow temperature of 230° C. (e.g., ΔT=205° C. relative to a room temperature of 25° C.) the die expands according to its $CTE_{die}$ and the solder bump center correspondingly expands to L and W coordinates of 12056.4 and 9555.1 µm, respectively, and therefore $D_{pad\ reflow}$ for the solder bump equals 15383.7 µm. The substrate expands according to its $CTE_{substrate}$ and the bump pad center correspondingly expands to L and W coordinates of 12079.6 and 9573.5 µm, respectively. Therefore $D_{substrate\ reflow}$ for the bump pad equals 15413.3 µm. Therefore $ΔD_{offset}$ equals 29.6 microns (e.g., |15413-15384|,) and SF equals 0.998073. Consequently, for a production substrate of the example package the bump pad will be relocated such that the lateral distance between a center of the die (positioned at its target mounting location relative to the substrate) and the bump pad on the production substrate at room temperature equals 15345.9 µm (e.g., $SF \times D_{rt}$=0.998073×15375.5 µm).

Alternatively $ΔD_{offset}$ can be calculated by first calculating L and W offsets ($L_{off}$ and $W_{off}$ respectively) using the formulas: $L_{off}=ΔT\times ΔCTE \times L_{rt}\times 10^{-6}$ and $W_{off}=ΔT\times ΔCTE \times W_{rt}\times 10^{-6}$ where $L_{rt}$ and $W_{rt}$ are the L and W coordinates of the solder bump center at room temperature in microns (e.g., 12050 µm and 9550 µm), respectively, and then calculating $ΔD_{offset}$ using the formula $ΔD_{offset}=\sqrt{(L_{off}^2+W_{off}^2)}$ (e.g., 29.6 microns=$\sqrt{(23.22^2+18.40^2)}$).

As demonstrated by the above example, the re-positioning of some embodiments of the bump pad center relative to the die center on a production substrate compared to a test substrate at room temperature can result in a surprisingly large offset distance of about 30 µm (e.g., $ΔD_{offset}$=15345.9 µm-15375.5 µm). In other embodiments, depending on the position of the solder bump of the die and corresponding bump pad on the substrate, the ΔT, and, the ΔCTE, the offset distance $ΔD_{offset}$ can vary widely, e.g., ranging from 1 or 2 µm to 50 or 70 µm. For example continuing with the same example IC package, for solder bump and corresponding bump pad locations having L and W coordinate locations of 1000 and 1000, 5000 and 5000 or 10000 and 10000 µm relative to the die center, $ΔD_{offset}$ would equal about 1.36, 6.81 and 13.6 µm, respectively. In contrast, for L and W coordinate locations of 40000 and 40000 µm or 50000 and 50000 µm, $ΔD_{offset}$ would equal about 54.5 and 68.1 µm, respectively.

Additionally, the relative advantage of applying the method 300 to re-position the bump pad center, e.g., to facilitate providing a bond joint with improved integrity, will also depend upon the relative diameters of the solder bump and bump pad. For instance, for solder bumps and bump pads having diameters in a range of 10 to 20 µm, re-positioning the bump pad center by a $ΔD_{offset}$ of about 2, 4 or 6 µm may substantially improve the integrity of the subsequently formed bond joint, while a similar degree of re-positioning of solder bumps and bump pads having diameters in a range of 90 to 100 µm may have a smaller effect on improving the integrity of the bond joint, although integrity is still expected to improve.

Herein, the alignment reflow temperature refers to a temperature where the solder bump and bump pad are aligned with each other to form the bond joint during the heat reflow cycle, e.g., due to the application of the shrinkage factor (SF) to re-position the bump pad location on the production substrate. In some embodiments of the method 300, the alignment reflow temperature at which to determine the shrinkage factor may be evaluated empirically, e.g., by performing the method 300 on a series of different test and production dies and substrates using different prospective SF values and then evaluating the integrity of the bond joints thus formed.

In some embodiments, for instance, the alignment reflow temperature occurs at a temperature that is less than a maximum temperature during the heat reflow cycle (e.g., about 260° C. in some embodiments) and greater than a melting temperature of the solder bump (e.g., about 220° C. in some embodiments for some embodiments of solder bumps composed of lead free solder). In some embodiments, the alignment reflow temperature occurs at a temperature that is in a range of about 20 to 40° C. lower than a maximum temperature during the heat reflow cycle In some embodiments of the method 300 the heat reflow cycle includes elevating the temperature of the substrate and die from room temperature (about 25° C.) to about 250 to 270° C. (about 260° C. in some embodiments) and then reducing the temperature back to room temperature over a cycle period ranging from 5 to 60 seconds. One skilled in the pertinent art would be familiar which various heat reflow cycles as appropriate for different combinations of dies, substrates, solder bump and bump pad compositions and combinations.

The method 300 can be applied to manufacture any sized combination of die and substrate, but may be particularly advantageous when the major surface of the integrated circuit die has a footprint area (perimeter 145) of at least about 400 mm$^2$ and/or when a ratio of $CTE_{sub}$ to $CTE_{die}$ is at least about 3:1 and/or the solder bump is in a perimeter region of the die such as a corner region such as discussed in the context of FIGS. 1-2.

Based on the disclosed method, one skilled in the pertinent art would appreciate how the method 300 could be repeated for each of the solder bumps and corresponding bond pads on the die and substrate, respectively, to re-position the entire array of bond pad locations on a production substrate for improved alignment and bond joint integrity. For instance, in some embodiments the production solder bump and the production bump pad are part of an array of solder bumps and corresponding bump pads that are bonded to each other as part of a flip chip bonding process that includes the application of the heat reflow cycle.

Those skilled in the art to which this application relates will appreciate that other and further additions, deletions, substitutions and modifications may be made to the described embodiments.

What is claimed is:

1. An integrated circuit package, comprising:
   an integrated circuit die having a major surface and one or more solder bumps located on the major surface in at least one corner region of the major surface; and
   a substrate having a surface, the surface including bump pads thereon, wherein:
   the major surface of the integrated circuit die faces the substrate surface, the one or more solder bumps are bonded to individual ones of the bump pads to thereby form a bond joint, the major surface of the integrated circuit die has a footprint area of at least about 400 mm², and a ratio of a coefficient of thermal expansion of the substrate ($CTE_{sub}$) to a coefficient of thermal expansion of the integrated circuit die ($CTE_{die}$) is at least about 3:1.

2. The package of claim 1, wherein an average diameter of the one or more solder bumps is a value in a range from about 10 to 200 microns.

3. The package of claim 1, the corner region has a separation distance from a center of the integrated circuit die major surface that is equal to or greater than about 40 percent of a diagonal distance of the major surface.

4. The package of claim 1, wherein the one or more solder bumps are part of an array on the major surface, the solder bumps of the array of solder bumps individually bonded to a corresponding array of the bump pads on the substrate surface to form an array of the bond joints.

5. The package of claim 1, wherein the one or more solder bumps include an under bump metallization region, the under bump metallization region located between a redistribution metal layer and a pillar layer including copper, the pillar layer located over layer including nickel and a solder layer.

6. The package of claim 1, wherein each of the bond joints has an alignment such that a center line of the solder bump and a center line of the bump pad are laterally displaced by a separation distance that is less than about one-half a diameter of the solder bump.

7. The package of claim 1, wherein the IC die is composed of an inorganic semiconductor material having a $CTE_{die}$ value in a range from about 2.5 to 3.5.

8. The package of claim 1, wherein the IC die is a silicon die.

9. The package of claim 1, wherein the substrate is composed of organic material having a $CTE_{sub}$ value in a range from about 10 to 16.

10. The package of claim 1, wherein the substrate is a printed circuit board, and includes multiple metal vias connected to the bump pads, the metal via located in interconnection layers of the substrate.

11. The package of claim 1, wherein the bump pads includes a C4 pad.

12. The package of claim 1, wherein the package is a data center/server device package, a system-on-a-chip (SoC) package, a graphical processing unit device package, central processing unit package, an AI machine learning device package, or combination thereof.

13. The package of claim 12, wherein the package is adapted for use in a motorized vehicle.

14. The package of claim 1, wherein locations of the bump pads on the substrate are offset by a shrinkage factor multiplied by test bump pad locations on a test substrate such that a lateral distance between a center of a test integrated circuit die and the bump pad on the test substrate at room temperature equals SF×Drt, wherein:

$SF=1-(\Delta D_{offset}/D_{rt})$, $D_{rt}$ is a distance between a center of the test die and a center of the solder bump with the solder bump and the bump pad aligned with each other and the test die at a target mounting location at room temperature, $\Delta D_{offset}=|D_{substrate\ reflow}-D_{pad\ reflow}|$, $D_{substrate\ reflow}$ is a lateral offset distance between the center of the test die, and $D_{pad\ reflow}$ is an offset distance between the center of the test die and the solder bump, with the test die positioned at the target mounting location and with the test die and the test substrate at an alignment reflow temperature for bonding the solder bump to the bump pad.

* * * * *